United States Patent [19]

Kamiya et al.

[11] Patent Number: 4,751,136
[45] Date of Patent: Jun. 14, 1988

[54] SUBSTRATE FOR HIGH-FREQUENCY CIRCUIT AND PROCESS FOR MAKING THE SAME

[75] Inventors: Masaki Kamiya; Takao Sugawara; Kenji Tsukanishi, all of Shimodate; Yutaka Yamaguchi; Mitsuo Yokota, both of Yuki; Masao Asaoka, Tsukuba, all of Japan

[73] Assignee: Hitachi Chemical Co. Ltd., Tokyo, Japan

[21] Appl. No.: 91,603

[22] Filed: Aug. 31, 1987

[30] Foreign Application Priority Data

Aug. 29, 1986 [JP] Japan ............... 61-204062
Aug. 29, 1986 [JP] Japan ............... 61-204064

[51] Int. Cl.⁴ .................. B32B 3/10; B32B 3/14; B32B 5/16
[52] U.S. Cl. .................. 428/317.1; 156/77; 264/45.1; 428/317.7; 428/317.9; 428/319.1; 428/461
[58] Field of Search .......... 428/312.2, 312.6, 312.8, 428/317.1, 317.7, 317.9, 319.1, 461; 264/45.1; 156/77

[56] References Cited

U.S. PATENT DOCUMENTS

| | | | |
|---|---|---|---|
| 4,212,733 | 7/1980 | Goto et al. | 428/317.9 |
| 4,219,602 | 8/1980 | Conklin | 428/317.9 |
| 4,221,835 | 9/1980 | Severus-Laubenfeld | 428/319.1 |
| 4,647,500 | 3/1987 | George et al. | 428/319.1 |

FOREIGN PATENT DOCUMENTS

| | | | |
|---|---|---|---|
| 2901623 | 7/1980 | Fed. Rep. of Germany | 428/317.9 |
| 60-167394 | 8/1985 | Japan | . |
| 62-69580 | 3/1987 | Japan | . |

Primary Examiner—William J. Van Balen
Attorney, Agent, or Firm—Antonelli, Terry & Wands

[57] ABSTRACT

A substrate for high-frequency circuits best suited as a substrate for a flat antenna to receive satellite-broadcast microwaves or as a similar substrate, the substrate comprising (i) a porous insulator layer wherein the proportion by volume of open cells to all the cells is at least 50% and (ii) a metal foil laminated over at least one side of the insulator layer through (iii) a water-impermeable film, and a process for making such substrates.

5 Claims, 1 Drawing Sheet

SUBSTRATE FOR HIGH-FREQUENCY CIRCUIT AND PROCESS FOR MAKING THE SAME

BACKGROUND OF THE INVENTION

1. Field of the Invention

The present invention relates to a substrate for circuits, such as one for a flat antenna to receive satellite-broadcast microwaves, which is fitted for use in a high frequency region. The invention also relates to a process for making such substrates.

2. Description of the Prior Art

As described in Nikkei Electronics, No. 347, pp. 145-160 (1984, issued by Nikkei-MeGraw Hill Corp.), flat antennas for receiving satellite-broadcast microwaves or other microwaves include those of a type in which wave power is received by a number of resonators arranged on copper foils or the like laid on one side of a dielectric substrate and the received power is matched through micro-strip lines, collected at one or more sites, and led through coaxial cables to a converter, tuner, or the like. However, the high-frequency power, on passage through a conductor including dielectric substances, is much attenuated by the surface resistance and the like, that is, the wave power from the resonators is lost greatly when propagated through the strip lines (the transmission loss is large). A conceivable method for reducing this transmission loss comprises dividing the opening of the flat antenna into several sections, reducing the lengths of the strip lines, collecting the wave power from the resonators at the centers of these sections, and connecting these sections together through coaxial cables of small transmission loss. This method, however, has drawbacks in that the connection of strip lines with coaxial cables is complicated and a large number of works are necessary for the fabrication. Accordingly it is desirable that a number of resonators be arranged on a substrate, connected together at one site through micro-strip lines, and coupled with a coaxial cable. For this purpose the substrate should be provided with micro-strip lines through which the transmission loss is small. The transmission loss is the ratio, expressed in dB, of the transmitted power to the supplied power per 1 m of the transmission path, that is, the loss is represented by the formula $$\text{Transmission loss [dB/m]} = -10 \log \frac{X}{100}$$

wherein X is the transmitted power when the supplied power is taken as 100. For instance, a transmission loss of 2, 3, or 4 dB/m means that 63, 50, or 40% of the power supplied at one end of a transmission path is transmitted by 1 m of the path and 37, 50, or 60% of the power is lost during the passage therethrough. Waves used in satellite brood casting are faint since such high power cannot be supplied in this case as in the case of ground broadcasting where VHF or UHF is used, so that substrates of small transmission loss are required in order to increase antenna gains as well. In order to reduce the transmission loss, it is necessary to use a substrate having a low dielectric constant and a low dielectric loss tangent.

Therefore the insulating layers of such substrates are formed of materials having low dielectric constants and dielectric loss tangents, such as polytetrafluoroethylene, polyethylene, polypropylene, polystyrene, polyisobutylene, and polymethylpentene-1 and of minimized amounts or none of such reinforcements as glass fiber, paper, and the like since these reinforcements have high dielectric constants and dielectric loss tangents.

On the other hand, in order to obtain circuits having a low dielectric constant and a low dielectric loss tangent there are proposed the method of incorporating hollow micro-spheres (micro-baloons) (Japanese patent application Laid-Open No. 167394/85) and the method of blending quartz glass fiber with glass fiber that is a base material which is impregnated with a synthetic resin and heated and pressed to produce laminates (Japanese patent application Laid-Open No. 109347/84).

Recently, frequencies of waves for use in the fields of electronic industry and communication industry have shifted gradually to higher-frequency regions and interest has moved from the region of kilohertz that have hitherto been used extensively to the region of megahertz or gigahertz. In these higher-frequency regions, energy loss in wave transmission is large and hence materials of lower dielectric constants and loss tangents have been desired.

However, when polytetrafluoroethylene or polyethylene, which has a low dielectric constant and a low dielectric loss tangent, is used for the substrates, the process for fabricating antennas will be complicated and additionally there is a limit of decreasing the transmission loss, so that none of satisfactory substrates have been obtained.

As regards the method of incorporating hollow micro-spheres, a number of operation steps are required and if the dispersion of the hollow micro-spheres in the insulating layer is insufficient, dielectric properties of the resulting substrate for circuits will be locally uneven. In addition, when the adhesion of the hollow micro-spheres to the matrix of the insulating layer is insufficient, water will penetrate into the layer and increase the dielectric constant and the dielectric loss tangent. Moreover, the dielectric constant and the dielectric loss tangent are not so much decreased with an increase in the content of hollow micro-spheres, since materials of relatively high dielectric constants and dielectric loss tangents are used in most cases for the micro-spheres. Laminates comprising quartz glass fiber as a base material are expensive and in addition it is limited to decrease the dielectric constant and the dielectric loss tangent by using such laminates.

Since the thermal expansion or contraction of gases is larger than that of solids, circuit-supporting substrates containing hollow micro-spheres, which are closed cells, undergo large dimensional changes in the directions of length, width, and thickness as the gas in the spheres expands or contract with seasonal and daily variations in temperature. Changes in the warp and thickness of these substrates are larger than in those of circuit-supporting noncellular substrates.

For instance, when a circuit-supporting substrate containing hollow micro-spheres in the insulating layer is used for a flat antenna to receive microwaves, said warp causes problems such as a shift of received wave phase. A change in the thickness also raises a problem in that the range of receivable wave frequencies is shifted thereby.

SUMMARY OF THE INVENTION

It is an object of the invention to provide a substrate for high-frequency circuits which have a low dielectric constant and a low dielectric loss tangent, undergoes less changes of the warp and thickness with temperature, does not allow water penetration thereinto, and have dielectric properties uniform throughout the entire body thereof.

Another object of the invention is to provide a process for making such substrates.

Figure 1:
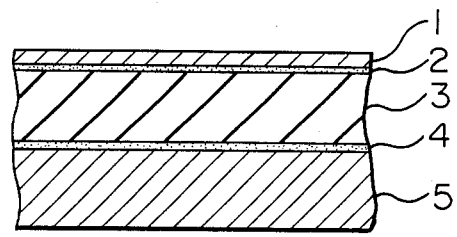
FIG. 1 is a cross-sectional view of a substrate for high-frequency circuits which are an embodiment of the present invention.

In the drawing, 1: a metal foil such as a copper foil which will be processed to form circuits, 2: a water-impermeable film, 3: an insulator layer, 4: a water-impermeable film, and 5: a metal plate as grounding conductor.

DETAILED DESCRIPTION OF THE INVENTION

A part or all of the insulator layer 3 is porous and at least 50% (volume fraction, the same applies hereinafter) of these pores have continuous-cell (open cell) structure. The part or all of the insulator layer 3 may be either a thermoplastic resin foam or a structure having air in the interstices between powder particles of a thermoplastic resin, thermosetting resin, or ceramic material which are bonded or fused together. It is necessary that at least 50% of the pores should have open-cell structure.

This is because the dimensional variation and the warp will be undesirably large if the proportion of open cells is less than 50%, that is, the proportion of closed cells is at least 50%. Preferably, the proportion of open cells is at least 90%.

The volumes of open cells and closed cells are determined in the following way:

First a rectangular piece is cut off from the insulator layer 3 and the following volumes are measured.

$V_1$ The volume of the insulator layer 3 (the volume of the material itself constructing the insulator layer 3 + the volume of closed cell + the volume of open cells). This volume is determined by measuring the outside dimensions of the piece $V_2$ The sum of the volume of the material itself constructing the insulator layer 3 and the volume of closed cells. $V_2$ is determined by immersing the piece in a liquid, allowing it to penetrate into the open cells. Thus, $V_2$ is calculated from the formula $$V_2 = \frac{Z_1 - Z_2}{\rho_1}$$

wherein, $Z_1$ is the weight of the piece in the air, $Z_2$ is the weight of the same in the liquid after completion of the liquid penetration into the open cells, and $\rho_1$ 1 is the density of the liquid.

When the density of the material itself constructing the insulator layer 3 is denoted by $\rho$, the volume of the closed cells is denoted by $V_i$, and the volume of the open cells is denoted by $V_s$, $V_i$ and $V_s$ are calculated from the following respective formulae:

$$V_i = \frac{\rho V_2 - Z_1}{\rho}, \quad V_s = V_1 - V_2$$

The condition that the proportion of the open cells shall be at least 50% is as follows:

$$\frac{V_s}{V_i} = \frac{V_1 - V_2}{(\rho V_2 - Z_1)/\rho} = \frac{\rho(V_1 - V_2)}{\rho V_2 - Z_1} \geq 1$$

The condition that the proportion of the open cells shall be at least 90% is as follows:

$$\frac{V_s}{V_i} = \frac{\rho(V_1 - V_2)}{\rho V_2 - Z_1} \geq 9$$

Reasons for providing the water-impermeable films 2 and 4 are that the penetration of any of various solutions and solvents into the circuit substrate is prevented by these films during the processing of the metal foil 1 to form circuits and other operations, that the adhesion of the insulator layer 3 to the metal foil 1 and the metal plate 5, which are conductor layers, is enhanced through these films, and that the substrate surface is protected by these films so as not to become uneven when exposed to varying temperatures.

The thickness of the water-impermeable films 2 and 4 is desirably minimized for the purpose of maintaining the dielectric constant and the dielectric loss tangent at low levels. These films may be formed of a plastic or a plastic adhesive.

When there is a fear of the penetration of any of various solutions and solvents into the circuit-supporting substrate through its end surfaces or inner walls of holes bored in it, such portions are sealed with a caulking type of adhesive or the like during the processing for circuit fabrication. After completion of the processing, a part or all of the sealant applied is removed so that open cells in the circuit-supporting substrate may recover communication with the surrounding air.

The powder of the insulator may be formed of thermoplastic or thermosetting resins. Such resins include; polyolefin homopolymers, e.g. polyethylene, polypropylene, poly-1-butene and poly-4-methyl-1-pentene; polyolefin copolymers, e.g. ethylene-propylene copolymer, ethylene-1-butene copolymer, propylene-1-butene copolymer, and ethylene-vinyl acetate copolymer; fluororesins, e.g. polytetrafluoroethylene, tetrafluoroethylene-hexafluoroethylene copolymer, tetrafluoroethylene-perfluoroalkoxyethylene copolymer, trifluorochloroethylene-tetrafluorethylene copolymer, vinylidene fluoride polymer, and vinyl fluoride polymer; polystyrene, acrylonitrile-styrene copolymer, and acrylonitrile-butadiene-styrene copolymer; polycarbonate; acrylate resins, e.g. polymethyl methacrylate; polyvinyl butyral, polyvinyl formal, polyimide, polyamide, polyamideimide, polyphenylene sulfide, polyethersulfone, polysulfone, polyarylate, polyether ether ketone, polyphenylene oxide, polyetheramide, polyetherimide, polyisobutyrene, polyoxybenzylene, polybutylene terephthalate, polybutadiene, polyester, polyvinyl chloride, polyvinylidene chloride, urea resin, melamine resin, benzoguanamine resin, phenol resin, epoxy resin, silicone resin, formalin resin, xylene resin, furan resin, diallyl phthalate resin, polyisocyanate resin, and phenoxy resin. These polymers also may be suitably modified. Further, mixtures of these polymers and copolymers comprising these polymer units can also be used. If necessary, these insulators may contain any of crosslinking agents, hardeners, and other additives. Powders of these plastic coated with other resins can also be used.

Other suitable insulator powders for use herein include those of ceramics such as a alumina, mullite, magnesia, zirconia, beryllia, thoria, spinel, and barium titanate. These ceramic powders coated with plastics can also be used.

Powders of two or more insulators can be used in combination.

Thermosetting resins hardened to any degree may be used so far as the degree of hardening has no adverse effect on the adhesion between neighboring particles of the resin.

Preferred insulators are thermoplastic resins in that neighboring particles thereof can be fused together with ease by applying heat and pressure. Particularly preferred are polyolefin resins and fluororesins, which have little polar radicals and low dielectric constants and dielectric loss tangents. Such resins include, for example, homopolymers of ethylene, propylene, and tetrafluoroethylene, crosslinked products or modified products of these polymers, and copolymers consisting of units of these polymers.

Suitable powders of insulators for use herein have average particle diameters of 0.001 to 1 mm. If the average particle diameter exceeds 1 mm, the average size of the air-filled interstices or air-filled cells between particles of the insulator will be near to the wavelength of the high-frequency wave to receive and this may have adverse effect. When the average size of the air-filled interstices is up to 1/100 of the wavelength, no problem arises. For instance, when the resulting circuits are used at a frequency of 12 GHZ, the average size of the air-filled interstices should be up to 0.25 mm. On the other hand, when the average particle diameter is less than 0.001 mm, air-filled interstices necessary between particles of the insulator are difficult to form.

The insulator layer is formed as follows: A water-impermeable film 4 is superposed on a metal plate 5, an insulator powder is scattered to a definite thickness on the water-impermeable film 4, a water-impermeable film 2 and a metal foil 1 are superposed in turn over the layer of the insulator powder, and heat and pressure are applied to all the layers to bond them one to another and simultaneously fuse or bond together the particles of the insulator powder so that suitable air-filled interstices may remain between neighboring particles of the powder, whereby the insulator layer is made up.

Alternatively, sheet may be formed in advance from an insulator powder in such manner that parts or all of the particles of the powder may be fused or bonded to the neightboring particles of the powder and air-filled interstices may remain between these particles.

For instance, in the case of a thermoplastic resin powder or the like, there is the method of sintering the powder without applying pressure or under contact pressure. In the case of a thermosetting resin powder or the like, there is the method of heating and pressing a powder not completely cured, thereby bonding together neighboring particles of the powder. In the case of ceramics, a powder thereof is sintered according to the known method so that interstices may remain between particles of the powder. Another method is to coat insulator particles previously with an adhesive and form a sheet from these particles by applying heat and pressure. According to any of these methods, an insulator powder can be easily formed into a sheet. The layer of the insulator powder or the sheet-shaped product of the insulator powder should have a thickness of 0.2 to 10 mm since it is for use in a circuit-supporting substrate.

The bonding of the metal foil 1 through the water-impermeable film 2 to the insulator layer 3 by applying heat and pressure is for the purpose of protecting properties of the substrate from degradation. If the metal foil is directly bonded to the insulator layer, such degradation will be caused through the following processes: (i) Since the insulator layer 3 is porous, an etching solution, when circuits are fabricated on the substrate, penetrates into cells of the insulator layer through surface holes thereof, (ii) the side etching of the metal foil circuit occurs subsequently, and (iii) after fabrication of the circuit, the solvent of the penetrating etching solution evaporates and the solute remains inside the substrate. The water-impermeable film 2 serves also to prevent the water absorption through the substrate surface after fabrication of circuits. Moreover, the film 2 serves to enhance the adhesion of the metal foil. Desirable water-impermeable films are thermoplastic resin films, films formed from a resin dissolved in a volatile solvent, and sheets formed by impregnating glass cloths or paper sheets with the above-mentioned resin suitable for use as an insulator in powder form. The resin dissolved in a volatile solvent is formed into a water-impermeable film by the method of applying the solution on a metal foil or on an insulator layer and then evaporating the solvent, or by some other method.

When a thermoplastic resin powder is used as the insulator, favorable water-impermeable films 2 are those of polyolefin resins having lower melting points than that of the resin to use as the insulator, those formed from such polyolefin resins dissolved in volatile solvents, and sheets formed by impregnating glass cloths or papers with such polyolefins.

The reason for the use of such a polyolefin resin is that, when the water-impermeable film thereafter is bonded with the metal foil by applying heat and pressure, the heating temperature is controlled to be higher than the melting point of the water-impermeable film and lower than the melting point of the insulator power, whereby the insulator powder can maintain its own form as such containing air-filled interstices and only the resin of the water-impermeable film can melt to produce bonding strength. The thickness of the water-impermeable film is free to vary according to the desired properties of the circuit-supporting substrate to be produced. But this film must be thicker than the maximum projection or depression at the bonding surface of the metal foil.

In the embodiment shown in FIG. 1, a water-impermeable film 4 is inserted between an insulator layer 3 and a metal plate 5. This film 4 serves chiefly to enhance the adhesion of the insulator layer 3 to the metal plate 5.

Prescribed conductor circuits are formed from the metal foil by etching or the like and the metal plate serves to reinforce the insulator layer.

The metal foil and the metal plate are formed of copper, white copper, bronz, brass, aluminum, nickel, iron, stainless steel, gold, silver, or platinum. Preferred metal foils are generally copper foils for printed circuit purposes. Particularly preferred of them are oxygen-free copper foils of extremely high purity since these foils exhibit less transmission loss of high-frequency waves. The metal plate serves also as an earthing conductor and to prevent the warpage of the substrate. A frame can be readily fitted to this metal plate by attaching a fixture to it. Preferably the metal plate is formed of aluminum, iron, or stainless steel. Copper silver, or gold plating may be applied on such a metal plate for the purpose of reducing the transmission loss of high-frequency power.

The metal plate may be omitted when it is unnecessary. Copper foils may be bonded one over each side of the insulator layer through a water-impermeable film.

A three-layer substrate for circuits is also possible which is formed by disposing a metal plate as an inner layer and a metal foil as an outer layer through an insulator layer and a water-impermeable film. Moreover a multilayer substrate for circuits is also possible which is constructed by disposing a plurality of metal plates. In any case, at least a water-impermeable film is interposed between an insulator layer and a conductor circuit. Usually the surface of the metal foil or the metal plate is coarsened to enhance the adhesion thereof. However, electrical signals in the high-frequency band tend to concentrate in surface layers of conductors and hence the current density in the surface layers increases. When the surface of a conductor is coarse, the length of the surface will be large and the resistance will be the higher and the transmission loss will be the larger. When the metal foil is formed of copper, the surface roughness thereof is desirably of the order of 10 to 2 $\mu m$, preferably from 2 to 3 $\mu m$.

Using materials described above, an insulator layer is bonded to metal foil or a metal plate through a water-impermeable film by applying heat and pressure. In this case, it must be kept in mind that also after preparation of the substrate for circuits, parts or all of the particles of the insulator powder should maintain the state of being fused or bonded to neighboring particles of the powder and air should be contained in the interstices.

The application of heat and pressure is conducted after an insulator powder has been scattered to a definite thickness on a water-impermeable film superposed on a metal foil from which conductor circuits will be formed. Alternatively, the application of heat and pressure is conducted after a metal foil from which conductor circuits will be formed has been overlaid successively with a water-impermeable film and with a sheet previously formed from an insulator powder so that the neighboring particles of the powder may maintain the state of being fused or bonded together and may contain air in the interstices.

In this case, the dielectric constant and the dielectric loss tangent are much affected by the density of the insulator layer of the circuit-supporting substrate and the transmission loss through the conductor circuit on the substrate is much affected by the density and thickness of the insulator layer. These density and thickness can be controlled to desired values by manipulating the thickness of the insulator layer, the thickness of the water-impermeable film, or the temperature and pressure when the metal foil or the metal plate is bonded to the water-impermeable film.

For instance, when it is desired that the mechanical strength of the substrate should take precedence of the low dielectric constant and dielectric loss tangent thereof, this can be achieved by increasing the thickness of the water-impermeable film and decreasing the thickness of the insulator layer. On the contrary, when it is desired that the low dielectric constant and dielectric loss tangent should take precedence of the mechanical strength, this can be achieved by minimizing the thickness of the water-impermeable film and increasing the thickness of the insulator layer. For controlling the density of the insulator layer, an example of suitable methods comprises preparing an insulator layer having a suitable thickness for the intended density and compressing the layer to a definite thickness when the layer is bonded to the metal foil or the metal plate. According to the production process of the present invention, the density and thickness of the substrate are thus controllable freely and desired values of the dielectric constant and dielectric loss tangent of the substrate and of the thickness of the insulator layer can be provided. Since the substrate is required to have a low dielectric constant and a low dielectric loss tangent when used for a high-frequency circuit, the density of the insulator layer is desired to be up to 0.9 g/cm$^3$. When used as a microstrip antenna in an SHF band, the circuit-supporting substrate serves as it is and hence the transmission loss through the wave path on the substrate is required to be minimized in order to achieve a high antenna gain. None of the circuit substrates commercially available today exhibit less values of the loss than 4 dB/m.12 GHz. According to the production process of the present invention, however, the loss can be reduced to 2 dB/m.12 GHz or less by using a polyethylene powder having a dielectric constant of 23 and a dielectric loss tangent of $1 \times 10^{-3}$ for the insulator layer, forming the water-impermeable film (60 m$\mu$ thick) from the same polyethylene, and controlling the density of the insulator layer to 0.7 g/cm$^3$ or less.

The present invention is illustrated in more detail with reference to the following examples.

EXAMPLE 1

A substrate for circuits was prepared which has a structure as shown in FIG. 1 and open cells in the insulator layer, and was processed to form circuits by using a negative film for testing. The conductor layer 1 used was a copper foil (tradename: NDGAC-35, an electrolytic copper foil supplied by Nippon Denkai Co., Ltd.) of 35 $\mu m$ in thickness.

The water-impermeable films 2 and 4 used were low-density polyethylene films 60 m$\mu$ thick.

The insulator layer 3 was formed from a polyolefin powder (tradename: MIPELON XM-220, supplied by Mitsui Petrochemical Industries, Ltd.) by sintering it according to the ordinary method.

The conductor layer 5 used was a 1.0 mm thick aluminum sheet in accordance with JIS 5052. The thickness of the insulator layer (including water-impermeable films) was 0.7 mm, the density thereof 0.7 g/cm$^3$, the percentage of remaining copper after fabrication of the circuit 30%, and the proportion of open cells 95%.

The difference between the warp of the substrate at 0° C. and that at 80° C. was evaluated. The warp was determined by placing the substrate on a surface plate with the concave side of the substrate up, and measuring the maximum space between the substrate and the surface plate. Outside dimensions of the circuit-supporting substrate tested were 500×50 mm. The result of the test is shown in Table 1.

COMPARATIVE EXAMPLE 1

A substrate for circuits was prepared according to the procedure of Example 1 and circuits were fabricated therefrom by using the same test negative photo-mask that used in Example 1. An epoxy resin (tradename: Epikote 15, supplied by Yuka-Shell Epoxy Co., Ltd.) mixed with 10 wt %. of triethylenetetramine was applied on all the end surfaces of the circuit-supporting substrate to be tested and on all the inner walls of holes bored in the substrate, and was cured at room temperature to seal these surfaces.

The difference between the warp of the thus prepared substrate at 0° C. and that at 80° C. was determined in the same manner as in Example 1. The result thereof is shown in Table 1.

COMPARATIVE EXAMPLE 2

Circuits were fabricated from a substrate having no cell in the insulator layer by using the same test negative photo-mask that used in Example 1. While the materials used were just the same as in Example 1, the polyolefin powder was not sintered but melted by applying heat and pressure so that the insulator layer might contain no cell. The thickness and density of the insulator layer were 0.7 mm and 0.94 g/cm$^3$, respectively, and the percentage of remaining copper after fabrication of the circuit was 30%. The difference between the warp of the thus prepared substrate at 0° C. and that at 80° C. was determined in the same manner as in Example 1. The result thereof is shown in Table 1.

TABLE 1

| | Difference between warps at different temperatures (0° C. and 80° C.) | | |
|---|---|---|---|
| | Example 1 | Comparative Example 1 | Comparative Example 2 |
| Warp difference (mm) | 4.5 | 18.3 | 11.5 |

It can be seen from Table 1 that the circuit-supporting substrate of the present invention exhibits a very small change of warp with temperature as compared with a similar substrate but in which the cells are closed and with a similar substrate but which contains no cell.

EXAMPLES 2 AND 3 AND COMPARATIVE EXAMPLE 3

For the purpose of examining the dependence of the change of the warp with temperature on the proportion of open cells, substrates for circuits were prepared in which the respective proportions of open cells were 85% (Example 2), 52% (Example 3), and 36% (Comparative Example 3), and circuits were fabricated therefrom by using the same test negative film that used in Example 1.

The different proportions of open cells were obtained by varying the temperature, pressure, and period of sintering the polyolefin powder to form the insulator layers 3.

In the same manner as in Example 1, there circuit-supporting substrates were evaluated for the difference between the warp at 0° C. and that at 80° C. Results of the evaluation are shown in Table 2.

TABLE 2

| | Difference between warps at different temperatures (0° C. and 80° C.) | | |
|---|---|---|---|
| | Example 2 (open cells 85%) | Example 3 (open cells 52%) | Comparative Example 3 (open cells 36%) |
| Warp difference (mm) | 5.1 | 7.9 | 12.4 |

It may be seen from Table 2 that the warp changes greatly with temperature when the proportion of open cells is less than 50%.

EXAMPLES 4–7

A powder of polyolefin resin (tradename: MIPELON XM-220, an ultra-high molecular weight polyolefin powder supplied by Mitsui Petrochemical Industries, Ltd., average particle diameter 0.03 mm, m.p. 136° C.) as an insulator powder was exposed to vibration to be uniformed and then was sintered in an oven at 230° C. to form sheets (different in thickness).

The water-impermeable films used were polyethylene films (0.06 mm thick, m.p. 98° C.). The copper foils used were of the tradename NDGAC-35 (electrolytic copper foils supplied by Nippon Denkai Co., Ltd., 0.035 mm thick, treated with a silane) and the aluminum plates used were those of 1.0 mm in thickness meeting JIS 5052.

Each substrate for circuits was prepared by superposing the copper foil, polyethylene film, sheet of the insulator powder, polyethylene film, and aluminum plate in that order, and heating the superposed layers at 125° C. for about 10 minutes under a pressure of 45 kg/cm$^2$ to bond them together. In this case, insulator layers of different densities were obtained by compresing the different-thickness sheets of the insulator powder to a definite thickness with the aid of a spacer. Table 3 shows characteristics of the substrates of Examples 4–7.

COMPARATIVE EXAMPLE 4

A substrate for circuits was prepared according to the procedure of Examples 4–7 except that the insulator powder was thoroughly melted by raising the lamination temperature to 160° C. (in Examples 4–7 at 125° C.) to expel the air from among powder particles. Table 3 shows characteristics of the substrate of Comparative Example 4.

COMPARATIVE EXAMPLE 5

A substrate for circuits was prepared according to the procedure of Examples 4–7 except that the substrate was constructed without using the polyethylene film which is a water-impermeable film. Table 3 shows characteristics of the substrate of Comparative Example 5.

TABLE 3

| | Example 4 | Example 5 | Example 6 | Example 7 | Comparative Example 4 | Comparative Example 5 |
|---|---|---|---|---|---|---|
| Density of insulator layer (g/cm$^3$) | 0.90 | 0.84 | 0.72 | 0.61 | 0.92 | 0.73 |
| Dielectric constant [12 GHz] | 2.21 | 2.11 | 1.81 | 1.70 | 2.31 | 1.85 |
| Dielectric loss tangent [12 GHz] | $10 \times 10^{-4}$ | $5 \times 10^{-4}$ | $1 \times 10^{-4}$ | $1 \times 10^{-4}$ | $17 \times 10^{-4}$ | $1 \times 10^{-4}$ |
| Whether water was absorbed through substrate surface | None | None | None | None | None | Yes |
| Copper foil peel* | 1.0 | 1.0 | 0.9 | 1.0 | 1.5 | 0.05 |

TABLE 3-continued

| | Example 4 | Example 5 | Example 6 | Example 7 | Comparative Example 4 | Comparative Example 5 |
|---|---|---|---|---|---|---|
| strength (kg/cm) | | | | | | |

*Tensile lap-shear strength

In comparison of Examples 4–7 with Comparative Example 4 about the dielectric constant and dielectric loss tangent, the substrates of Examples 4–7 having air layers in the insulator layers showed low values as compared with the substrate of Comparative Example 4 having no cell. In Examples 4–7, the dielectric constant and dielectric loss tangent decreases as the volume fraction of air is increased and the density is decreased. As to whether water was absorbed through the substrate surface, the substrate of Examples 4–7 having polyethylene films as water-impermeable films did not absorb water while the substrate of Comparative Example 5 absorbed water. When the substrate of Comparative Example 5 was processed to fabricate circuits, the penetration of an aqueous cupric chloride solution used as a liquid for etching copper was observed and also after washing with water and drying, a green residue was observed. As to the copper foil peel strength, the substrates of Examples 4–7 having polyethylene films as water-impermeable films showed bonding strengths of about 1.0 kg/cm$^2$ while the substrate of Comparative Example 5 having no polyethylene film showed a very low value of 0.05 kg/cm$^2$.

(Effect of the Invention)

According to the present invention, it is possible to reduce the temperature dependence of the warp and length-, width-, and thickness-directional dimensions of substrates for high-frequency circuits. The present inventive substrate for circuits exhibits slight warp as compared even with that exhibited by a substrate for circuits which is constructed of just the same materials as used for the present inventive substrate but contains no cell. When used for a flat antenna to receive microwaves, a circuit-supporting substrate will be exposed immediately to seasonal and daily variations in temperature since the antenna is set up outdoors. Hence, these temperature variations have caused the significant warpage of such substrates and this has brought about reduction in the antenna gain. When the present inventive substrate supporting circuits is used for such an antenna, the reduction in the antenna gain can be minimized since the substrate exhibits less dependence of the warp on temperature than does the conventional substrate.

According to the production process of the invention, a substrate supporting circuits having the properties of low dielectric constant and low dielectric loss tangent can be obtained with ease. In addition, the dielectric constant and the dielectric loss tangent can be freely controlled by varying the volume fractions of air and the resin in the insulator layer. Moreover, a metal foil is bonded to the insulator layer through a water-impermeable film, whereby the pentration of ethcing solutions and water into the cells through the surface of the insulator layer can be prevented and a good adhesion of the metal foil to the insulator layer. Furthermore, the present production process pemits the use of diversified materials.

What is claimed is:

1. A substrate for high-frequency circuits which comprises (i) a porous insulator layer wherein the proportion by volume of open cells to all the cells is at least 50% and (ii) a metal foil laminated over at least one side of the insulator layer through (iii) a water-impermeable film.

2. The substrate for high-frequency circuits of claim 1, wherein the water-impermeable film comprises a plastic film or a plastic adhesive.

3. The substrate for high-frequency circuits of claim 1, wherein the water-impermeable film comprises a polyolefin film.

4. A process for making substrates for high-frequency circuits which comprise
scattering an insulator powder having an average particle diameter of 0.001 to 1 mm to a definite thickness on a water-impermeable film superposed on a metal foil, and
applying heat and pressure to the superposed layers to form an insulator layer wherein the particles of the insulator powder maintain the state of being fused or bonded to the neighboring particles of the powder and have air in the interstices between particles of the insulator and to bond together all the layer into a single body.

5. A process for making substrates for high-frequency circuits which comprise
overlaying a metal foil with a water-impermeable film and then with a previously formed insulator layer in sheet form wherein particles of an insulator powder having an average particle diameter of 0.001 to 1 mm maintain the state of being fused or bonded to the neighboring particles of the powder and have air in the interstices between particles of the insulator, and
applying heat and pressure to all the layers superposed to bond them into a single body.

* * * * *